Figure 1:
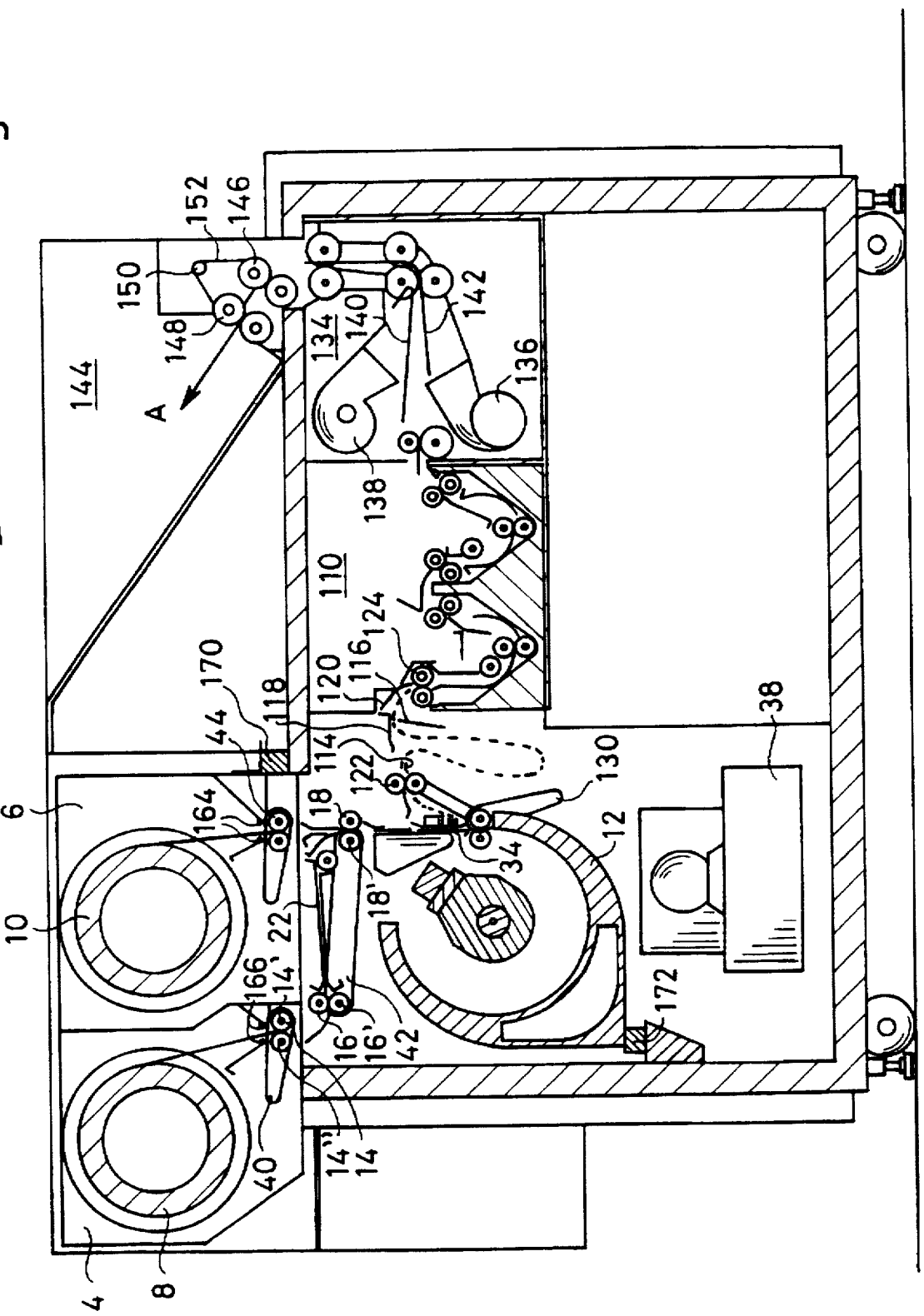

United States Patent [19]

Buus

[11] Patent Number: 5,731,866
[45] Date of Patent: Mar. 24, 1998

[54] APPARATUS AND A METHOD FOR IRRADIATING A SECTION OF A LENGTH OF A SHEET-LIKE MATERIAL

[75] Inventor: Peter Buus, Skovlunde, Denmark

[73] Assignee: Eskofot A/S, Ballerup, Denmark

[21] Appl. No.: 520,516

[22] Filed: Aug. 29, 1995

[51] Int. Cl.⁶ ...................................................... G03B 27/62
[52] U.S. Cl. ............................................. 355/75; 399/381
[58] Field of Search ........................................ 355/72, 75, 76, 355/18, 27–29; 399/381; 271/900

[56] References Cited

U.S. PATENT DOCUMENTS

| | | | |
|---|---|---|---|
| 4,000,942 | 1/1977 | Ito et al. | 271/900 |
| 4,464,043 | 8/1984 | Koumura et al. | 399/21 |
| 4,777,513 | 10/1988 | Nelson | 355/27 |
| 5,117,257 | 5/1992 | Tjonneland | 355/91 |
| 5,176,081 | 1/1993 | Buus | 101/477 |
| 5,339,148 | 8/1994 | Johnson et al. | 399/341 |

FOREIGN PATENT DOCUMENTS

| | | |
|---|---|---|
| 0572348A1 | 12/1993 | European Pat. Off. . |
| 0642254A1 | 3/1995 | European Pat. Off. . |
| WO91/031 | 3/1991 | WIPO . |
| WO91/0784 | 5/1991 | WIPO . |
| WO92/14609 | 9/1992 | WIPO . |

*Primary Examiner*—D. Rutledge
*Attorney, Agent, or Firm*—Cushman Darby & Cushman IP Group of Pillsbury Madison & Sutro, LLP

[57] ABSTRACT

An apparatus for irradiating a section forming an end portion of a length of a sheet-like material comprising a layer containing a photosensitive substance, where the boundary between said section and the rest of the length of material is defined by a divisional line, said apparatus comprising a supporting device defining a concavely curved, substantially circular cylindrical surface part; means for feeding the section in a first direction and into a first position in which the section is in abutting engagement with the cylindrical surface part and extends peripherally along the cylindrical surface part; irradiating means capable of irradiating at least a major part of said layer of said section containing said photosensitive substance and being adjacent to said divisional line; means for moving the length in a second direction substantially opposite to the first direction to a separating position, and separating means positioned at the separating position for separating the irradiated section from the rest of the length along said divisional line. The present apparatus is able to output an irradiated section having the desired dimensions directly after irradiation. No waste occurs between two irradiated images so that no cutting or the like is required in order to obtain the desired dimensions.

17 Claims, 4 Drawing Sheets

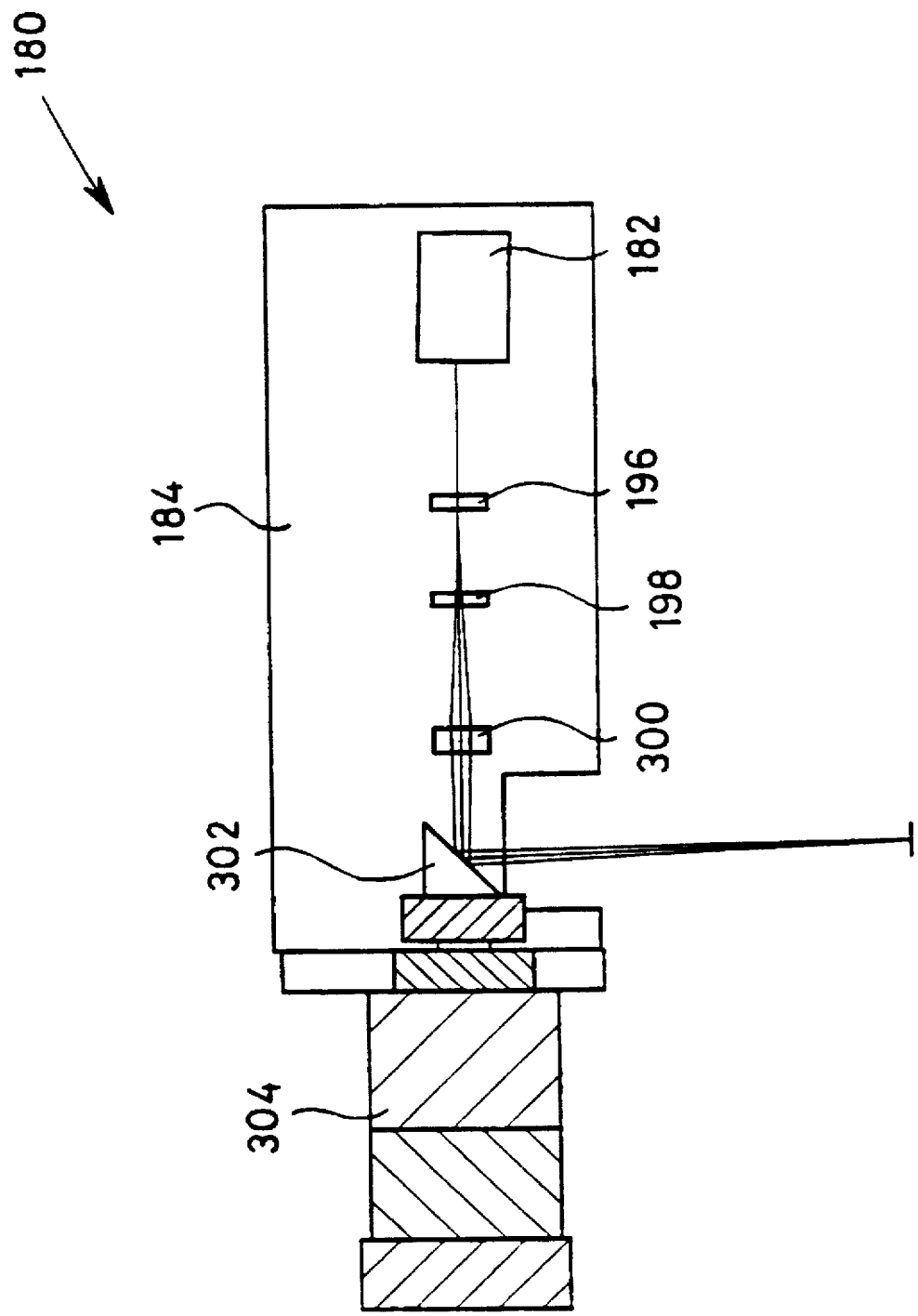

Fig. 6
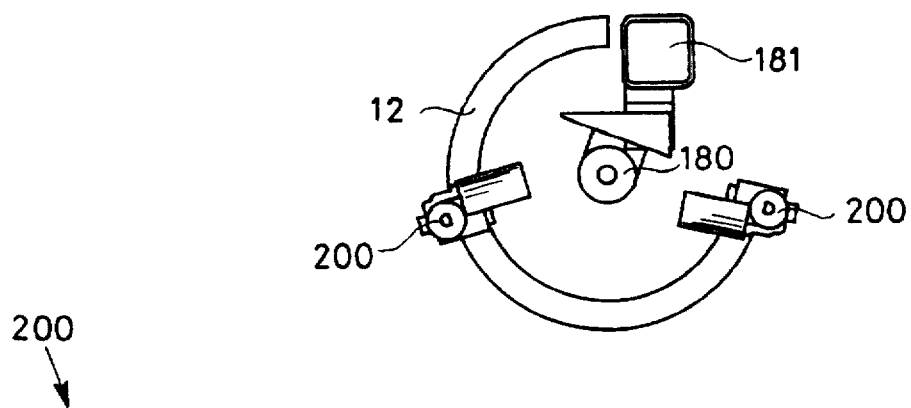
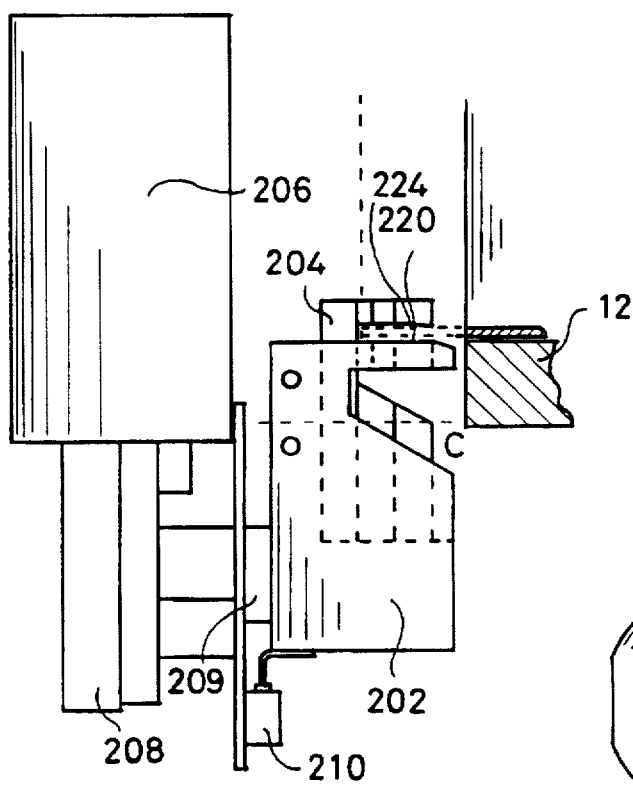
Fig. 4
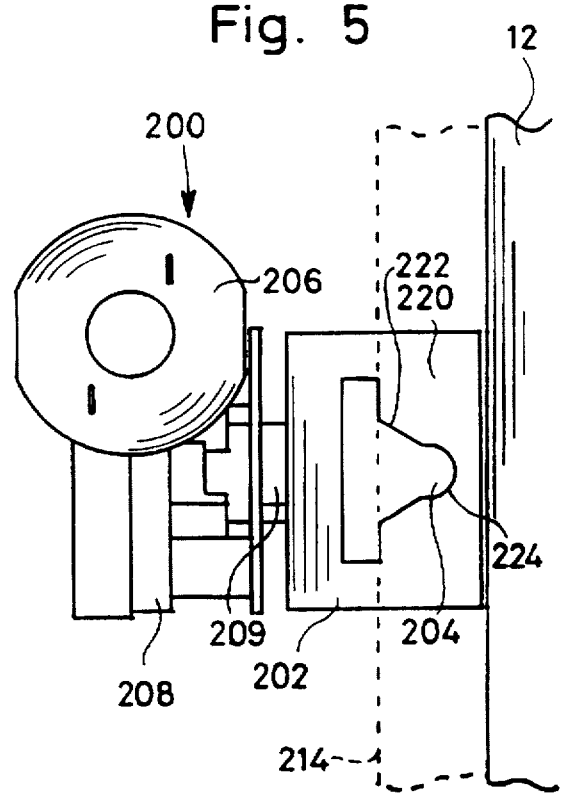
Fig. 5

APPARATUS AND A METHOD FOR IRRADIATING A SECTION OF A LENGTH OF A SHEET-LIKE MATERIAL

The present invention relates to an apparatus and a method for irradiating a section of a length of a sheet-like material comprising a layer containing a photosensitive substance.

Apparatuses for irradiating sheet-like materials for use in e.g. printing machines generally incorporate one of a few distinct elements: an internal drum, an external drum or a so-called flat bed by which the sheet-like material is held during irradiation thereof.

The present apparatus and method concern irradiating apparatuses and methods using the so-called internal drum principle.

In the art, apparatuses of this type have been used for producing irradiated sheets of material for use in e.g. printing machines. However, before introducing the sheets produced by the prior art apparatuses, these sheets usually require manual handling in order to remove excess sheet-like material which is required by the apparatus during irradiation but which is not desired during e.g. printing in a printing machine.

One such prior art apparatus may be seen from WO 92/14609 where, firstly, a section is cut from the length of material, whereafter this section is introduced into the internal drum for irradiation. In order to be able to remove the irradiated section from the internal drum, the section is cut to dimensions larger than those required by the irradiated image in order for the apparatus to be able to contact the section during irradiation so as to be able to remove the material subsequent thereto.

Contacting the section during irradiation at the photosensitive side thereof inside the area of the irradiated image will cause the formation of shadows in the image. Thus, the contact is performed outside the image, whereby the use of excess material is required in this apparatus.

In the present context, the desired dimensions means the desired dimensions along the original direction of the length of the sheet-like material. The dimension along the original direction of the width of the length is dictated by market standards and will be adapted to e.g. the printing machine. Each type of printing machine accepts a limited number of material widths, so that the irradiating apparatuses preferably should be able to handle a variety of widths. Thus, the dimensions of the irradiated sections are rarely corrected in this direction.

In fact, often one of the sides along the direction of the width of the length is used for positioning the irradiated image in the printing machine, whereby cutting of this side might cause positioning errors in e.g. a printing machine.

Other prior art instruments do not separate the irradiated image from the rest of the length of material before irradiation. Instruments of this type output the irradiated material at the other end of the internal drum compared to that at which the material is fed. In an instrument of this type, the irradiated section remains at least partly inside the internal drum, while the next section is irradiated. When the divisional line between two irradiated sections passes a cutting tool during feeding of more sheet-like material into the drum, the cutting is performed, whereby the cut-off section may obtain the desired dimensions.

Thus, in theory, apparatuses of this type may provide some of the advantages of the present apparatus and method. However, a period of time will lapse from the point in time at which an image has been irradiated till the section is output from the apparatus. In order to avoid this delay, operators may perform a "form feed" whereby the apparatus is instructed to feed film material until the irradiated image has been output from the internal drum and cut by the cutting tool. A large part of the thus fed film material will not be used in the subsequent irradiation of the subsequent image, whereby a waste of film material is introduced.

In a first aspect, the present invention relates to an apparatus for irradiating a section forming an end portion of a length of a sheet-like material comprising a layer containing a photosensitive substance, where the boundary between said section and the rest of the length of material is defined by a divisional line, said apparatus comprising a supporting device defining a concavely curved, substantially circular cylindrical surface part, means for feeding the section in a first direction and into a first position in which the section is in abutting engagement with the cylindrical surface part and extends peripherally along the cylindrical surface part, irradiating means capable of irradiating at least a major part of said layer of said section containing said photosensitive substance and being adjacent to said divisional line, means for moving the length in a second direction substantially opposite to the first direction to a separating position, and separating means positioned at the separating position for separating the irradiated section from the rest of the length along said divisional line.

In the present connection, the divisional line is a fictitious line which together with the three sides of the end portion of the length defines the section in question.

Typically, the irradiation is an illumination with infra-red or visible light. However, depending on the type of photo sensitive substance of the sheet-like material, the irradiation may also be performed using ultra-violet light or perhaps X-ray radiation. Naturally, the photosensitive substance and the irradiation means should match, so that the photosensitive substance of the sheet-like material is sensitive to the emitted radiation from the irradiating means.

The present apparatus provides an apparatus which produces irradiated sections having the desired dimensions and which is able to output the irradiated sections directly after irradiation.

Independently of where the separating means are positioned in relation to the internal drum, the irradiated section may be separated from the rest of the length of sheet-like material shortly after irradiation thereof in order to quickly provide the operator with the result of the operation. In addition, this fast action will not result in waste of sheet-like material.

One setup—which is the presently preferred setup—of this first aspect of the invention is a setup where the section subsequent to irradiation is at least withdrawn from the support device in order to have the divisional line transferred to the separating means.

In this setup, the second direction is a direction from the section toward the rest of the length of material, and the first direction is a direction from the rest of the length of material toward the section thereof. This means that, subsequent to separation of the section and removal thereof from the separating position and prior to feeding of the next section, no material is present in the supporting device.

An alternative setup of this first aspect of the present invention may be one where the two directions are interchanged. Thus, in order to move the section to the separation means, the length is moved in the direction from the rest of the length toward the section. In this setup, material is present in the supporting device—but not necessarily in abutting engagement therewith—when the separation is taking place.

In this alternative setup, the feeding of the next section means retracting the new cutting edge (now forming part of the next section) back into the supporting device (if the separating means are positioned outside the supporting device).

Thus, using the present apparatus, an irradiated section is output directly after irradiation, whereby the operator will not experience any undue delay. Furthermore, the only waste of sheet-like material in the present apparatus is the last piece of material, which is always wasted in instruments of this type, as there will be no waste of material between the individual irradiated images. However, as will be described further below, a preferred embodiment of the present apparatus further includes means for ensuring that this last piece of material is not introduced into the apparatus in a manner so that it may cause problems due to jamming etc.

In order to facilitate the fast outputting of a newly irradiated section, the present apparatus preferably comprises guiding means adapted to guide the section and to switch between a first and a second position where, in the first position, the guiding means are adapted to guide the section toward the supporting device when the feeding means feed the section of material and where, in the second position, the guiding means are adapted to guide the section away from the supporting device.

It will be clear that these guiding means will be most advantageous in the above-mentioned first, preferred setup, whereas they would most probably have only little effect in the above-mentioned alternative setup, where the cut-off section may not be in the way for the feeding of the next section.

Preferably, these guiding means are in their first position positioned between the separating means and the axially extending edge portion of the supporting device at which the length enters the supporting device when moving in the first direction. In this situation, when the divisional line is positioned adjacent to the separating means for separation of the section from the rest of the length, part of the section will be positioned in the guiding means being in their first position. Preferably, the guiding means are positioned close to the separating means in order for new cutting edge of the separated section to be guided by the guiding means.

Subsequent to separation, the guiding means may shift to their second position so that the section may be guided away from the supporting device in order to prepare the apparatus for irradiation of the next section.

Preferably, the divisional line is substantially straight so that a typical rotary cutter or the like may be used for the separation.

As described above, the largest problem in prior art apparatuses of this type is the fact that, usually, excess material is present at at least one of the cutting edges of the irradiated section. Thus, in order to prevent this, the present irradiating means are furthermore preferably capable of irradiating substantially all of the layer of the section containing the photosensitive substance at an end portion of said section being opposite to said divisional line. Thus, both cutting edges of the section may preferably be irradiated so that no excess material may be present at these positions. In fact, especially when the apparatus manufactures positive images, it may be preferred to irradiate the material e.g. 1 mm on the other side of the divisional line in order to take into account the inaccuracy of the separating means. If the apparatus alters between positive and negative images, care should be taken to alter the irradiation close to and on the other side of the divisional line.

Naturally, in order to be able to use all of the section introduced in the apparatus, the irradiating means are most preferably capable of irradiating substantially all of the layer of the section containing the photosensitive substance.

Apparatuses of the present type may just output the irradiated section for development and final use at another location. However, at present it is preferred that the apparatus further comprises developing and drying means for receiving, developing and drying the separated, irradiated section, and that the guiding means in their second position are adapted to guide the section toward the developing means.

Including development means in the apparatus provides an apparatus which outputs irradiated, developed and dried sections which have the desired dimensions and which are, thus, ready for the end use in e.g. a printing machine. Thus, the only manual handling required, if any at all, will be the transfer of the final product of the present apparatus to e.g. the printing machine.

In typical developer sections for materials of the most common type, the materials are transferred at a constant, relatively low velocity in order to ensure an even and desired development of the material. However, as transfer of materials in irradiating apparatuses is merely performed in order to transport the material from one position to another, the velocity of this transfer may be chosen higher and maybe less even than in developer sections, in order to speed up the overall processing time of a section in the irradiating apparatus.

Thus, it is preferred that said moving means comprise means for transferring the section with a first velocity and that said developing means comprise means for transporting the section at a substantially constant second velocity being smaller than said first velocity.

In order to ensure that the irradiated section does not prevent the introduction of the next section into abutting engagement with the supporting device, said developing means and said guiding means preferably interact so as to contain at least part of said section before and during introduction thereof into said developing means. Thus, "buffer"-means are preferably provided which hold the irradiated section so that the guiding means may be shifted to their first position in order to facilitate feeding of the next section into the supporting device.

In this manner, the rather slow development of an irradiated section may be performed while the next section is fed and irradiated. This feature removes a potential "bottle neck" as it facilitates parallel processing of the two operations in order to speed up the overall processing time of a section.

Naturally, the present apparatus preferably comprises storing means for holding at least a part of the length. These storing means preferably comprise sensor means for sensing the end of said length held in the storing means.

Preferably, more than one storing means is provided in order to either hold materials with different widths in order to facilitate shifting between these widths depending on the sizes of the images or in order to facilitate night runs, where a large number of sections are produced without requiring an operator to provide the apparatus with new material.

In some prior art apparatuses, the last part of a length of material may cause clogging and, thus, malfunction of the apparatus if introduced in the apparatus. Usually, this clogging occurs when a small piece of material is introduced in an apparatus where the distance between two sets of rollers or the distance between two guiding elements is larger than the size of the piece. In this situation, the guiding system of the apparatus will not be able to guide the piece, whereby it will remain in the guiding path of the apparatus.

This may be prevented, if the above-mentioned sensor means are used to stop the feeding of the length at a point where the length may still be e.g. re-introduced into the storing means for the operator to remove when replacing the empty roll of material. This is especially important if e.g. night runs are performed for large periods of time without operator assistance.

As the present apparatus preferably provides irradiated, developed sections ready for use, the apparatus is preferably able to function properly when positioned along side e.g. a printing machine. However, as a printing machine may generate vibrations which may interact with the very sensitive optics and positioning inside the irradiating apparatus, the present apparatus is preferably made stable to vibrations of this type.

Thus, the supporting device, the feeding means, the moving means, the irradiating means, the guiding means and the storing means of the present apparatus are preferably rigidly interconnected and vibrationally damped in relation to the rest of the apparatus.

When rigidly interconnecting these parts of the apparatus, it is ensured that no movement occurs therebetween. Movement between two of these parts may stress the sheet-like material or transfer vibrations to the sensitive parts of the apparatus.

At present, the vibrational damping is obtained using rubber elements having a size of e.g. a diameter of 30–40 mm, a height of 30 mm and a hardness of on the order of 40–45 shore. Naturally, the degree of compression will define the degree of damping of vibrations. At present, a compression of the above-mentioned rubber elements of the order of 1–3 mm is preferred in order to provide some damping while holding the rigidly interconnected elements sufficiently firmly in the apparatus.

In order to ensure that the section remains in place inside the supporting device during irradiation, the present apparatus preferably further comprises means for retaining the section of sheet-like material in abutting engagement with the cylindrical surface part during irradiation thereof.

Usually, these retaining means are vacuum means generating vacuum between the sheet-like material and the supporting device. However, also other means may be used, such as means abutting the material in order to force it against the supporting device or other means capable of performing this task.

In order for the apparatus to be able to produce a large number of irradiated sections, it preferably comprises outputting means which are able to hold the produced sections. In addition, these sections should be suitably stacked in order to remain in place during e.g. a night run.

Thus, the present apparatus preferably comprises means for outputting the irradiated section from the apparatus, said outputting means comprising means for translating said irradiated section during outputting, means for detecting the rear end of the section during translation thereof, and accelerating means for increasing the translation velocity of the section during outputting of at least the rear end of the section of sheet-like material.

This acceleration of the last part of the section will ensure that the sections are suitably stacked.

In a second aspect, the present invention relates to a method of irradiating a section forming an end portion of a length of a sheet-like material comprising a layer containing a photosensitive substance, the method comprising:

feeding the section in a first direction into abutting engagement with a concavely curved, substantially circular cylindrical surface part in a position in which the section extends peripherally along the cylindrical surface part, irradiating at least part of the layer of the section containing the photosensitive substance, moving the length of sheet-like material in a direction substantially opposite to the first direction to a separating position, separating the irradiated section from the rest of the length of sheet-like material, and removing the separated, irradiated section of sheet-like material from the separating position.

Also this second aspect may be split up into the two above-mentioned setups characterized by the interchanged first and second directions.

As described above, the first setup is the presently preferred setup. In this setup, it is preferred that the moving step only brings said section of sheet-like material partially out of engagement with the cylindrical surface part, that the separation step is performed while part of the section is still in abutting engagement with the cylindrical surface part, and that the removal step brings the section out of abutting engagement with the cylindrical surface part.

As described above, the shorter the paths the section is moved, the shorter time is used for this procedure.

As also described above, in this preferred setup, guiding means are preferably provided being adapted to guide the length and to shift between a first and a second position, where the guiding means are in the first position during the feeding step, the irradiation step, the moving step, and the separation step and are shifted to the second position subsequent to the separation step and prior to the removal step.

These guiding means help speeding up the procedure as they may provide the fast removal of the irradiated section from the path required in order to feed the next section into abutting engagement with the supporting device.

Figure 2:
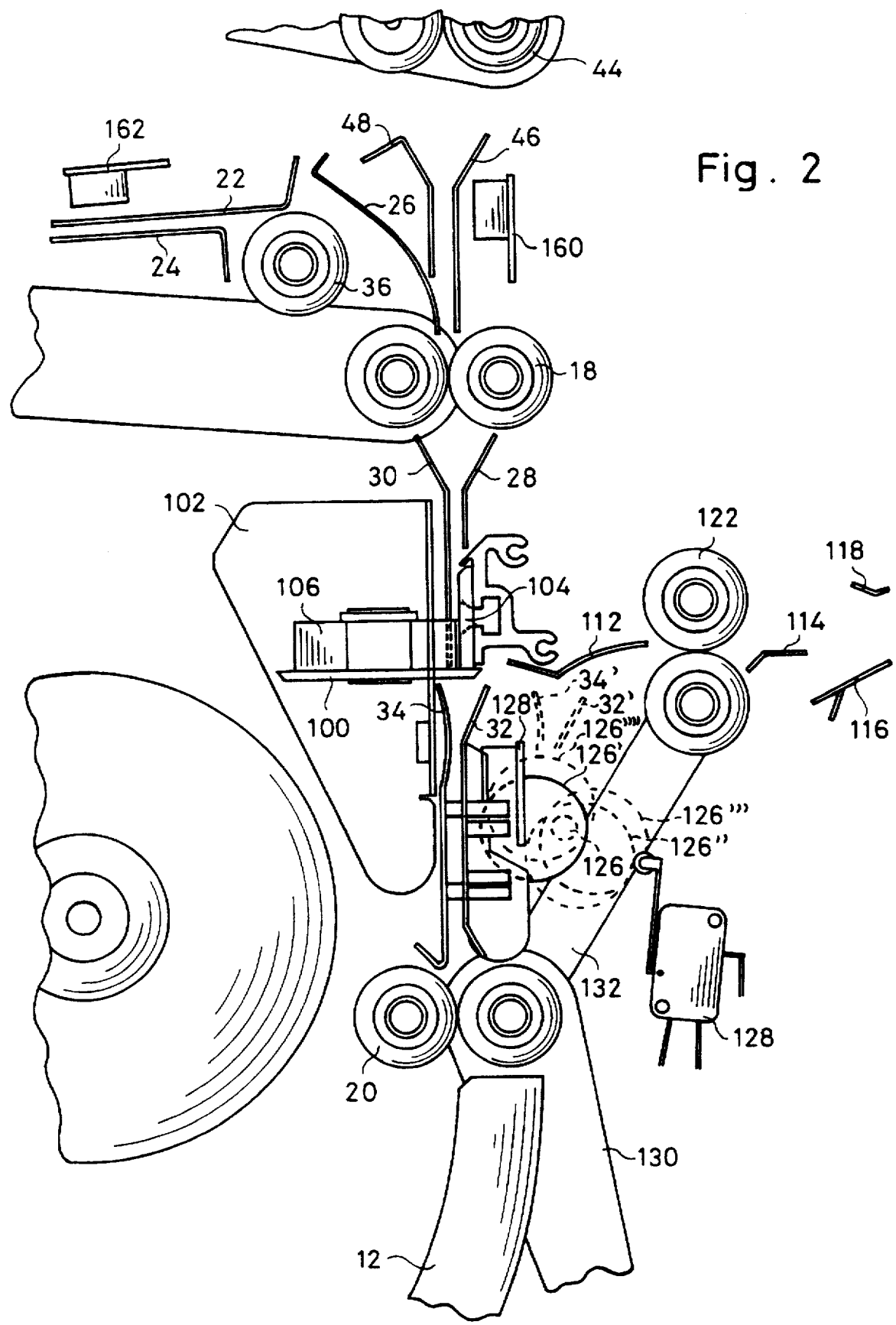

In the following, a preferred embodiment of the apparatus and method of the invention will be described with reference to the drawing on which:

FIG. 1 is a cross-section of the preferred embodiment of the apparatus according to the invention, FIG. 2 is a cross-section of a detail of FIG. 1 illustrating the operation of the guiding means, FIG. 3 is a block diagrammatic top view of a preferred embodiment of the irradiation means, FIG. 4 is a side view of the preferred registering edge portion providing means, FIG. 5 is a top view of the preferred registering edge portion providing means, FIG. 6 is a side view of the edge portion providing means of FIG. 5.

In FIG. 1, a presently preferred embodiment of an internal drum image setter 2 is illustrated. This image setter comprises two compartments 4, 6 for storing two spools 8, 10 holding the sheet-like material to be illuminated. The spools 8, 10 may hold sheet-like material having the same or different widths and/or thicknesses, in order to provide a versatile instrument 2.

In the present image setter, the first part of a length of sheet-like material is illuminated and subsequently separated from the rest of the length of material. The advantage of the present image setter is the fact that the illuminated part of sheet-like material may be illuminated to all four edges thereof, whereby subsequent manual handling thereof is unnecessary in order to adapt the illuminated sheet-like material for e.g. a printing machine and a waste of material between two irradiated images is avoided.

Feeding the sheet-like material from the spool 8 into position in the internal drum 12 is achieved (see also FIG. 2) using pairs of rollers 14, 16, 18 and 20 together with guides 22, 24, 26, 28, 30, 32 and 34 and helping roller 36. Having fed the front part of the sheet-like material into position, the part of the sheet-like material to be illuminated is fixed in the drum 12 by means of vacuum generated between the drum 12 and the sheet-like material using a suction unit 38 in a manner known per se. Illumination of the sheet-like material will be described further below.

In instruments of the present type, care should be taken when contacting the sheet-like material in order to transfer this through the instrument, as the photosensitive emulsion applied to one side of the material may easily be damaged due to wrong handling thereof.

The pair of rollers 14 is, thus, presently driven by a motor (not shown) through a toothed belt 40 which engages the roller 14' of the pair of rollers 14. The other roller 14" is preferably driven by the roller 14' via toothed wheels (not shown) and gently pressed against the roller 14' by means of a biasing spring (not shown). Using a setup of this type, the sheet-like material and the emulsion thereon is merely gently compressed when fed between the rollers. A less preferred alternative to the above-mentioned setup is a setup where only the roller 14' is driven by the motor means (not shown) and where the roller 14" is firmly pressed against the roller 14' in order to ensure engagement between the sheet-like material and the driving roller 14'. In this alternative setup, the sheet-like material and the emulsion thereon is unnecessarily stressed.

A similar setup may be seen in the pairs of rollers 16 and 18, where the rollers 16' and 18' are driven by motor means (not shown) via a toothed belt 42.

Feeding sheet-like material from the spool 10 to the drum 12 is, in a similar manner, performed using the pair of rollers 44, guides 46 and 48 and part of the guiding means described above, i.e. pairs of rollers 18 and 20 as well as guides 26, 28, 30, 32 and 34.

Illumination of the sheet-like material is performed, as it is known per se using a carriage moving along a linear track (not shown) and on which a laser and suitable optical elements are positioned as well as a rotatable mirror, which directs the laser light onto the photo sensitive substance of the sheet-like material.

An illumination means or carriage 180 of this type is illustrated on FIG. 3, where it comprises a laser 182 positioned on a base plate 184, lenses 196, 198 and 300, a rotatable mirror 302 and a motor 304 for rotating the rotatable mirror 302.

In addition, variable irises are preferably used to define the spot size of the radiation on the material. Furthermore, optical filters are used for coarsely defining the intensity of the radiation on the material. Fine adjustment (a factor of 2–3) may be accomplished by controlling the laser itself.

Illumination of the photo sensitive substance is consequently performed by rotating the rotating mirror 302, modulating the laser 182 and translating the carriage 180 in a manner so that the rotating mirror 302 translates along the symmetry axis of the substantially circular cylindrical surface of the drum 12 in order to have the same focused laser beam on all parts of the illuminated material.

In order to be able to precisely position the illuminated sheet-like material during a subsequent process, wherein this material forms the basis of e.g. a printing process, it is preferred to provide registering notches in the sheet-like material, which notches are precisely positioned in relation to the illuminated image.

Providing these notches is preferably performed while the sheet-like material is in the illumination position and, thus, in connection with the illumination thereof and most preferably before illumination cf. below.

In the present instrument 2, the sheet-like material is preferably fed into the drum 12 in a manner so that a part thereof extends beyond a side of the drum 12 in a direction parallel to a longitudinal axis thereof. Thus, part of the sheet-like material extends beyond the drum 12, whereby this part of the material is free for the engagement of notch providing means 200 which may engage with the sheet-like material without interfering with the drum 12.

As is illustrated in FIG. 4, the notch providing tools 200 comprise a base part 202 and a movable part 204 between which a gab is defined wherein the sheet-like material is introduced before making the notch. By operating a motor 206 which through a worm gear 208 and an eccentric 209 translates the movable means 204 from its first position illustrated in FIG. 4 to its second position, wherein it is submerged in the base means 202, and back, indentation of the sheet-like material is performed.

One center axis of the eccentric 209 is connected to the movable part 204 and the other center axis of the eccentric 209 is connected to the worm gear 208.

The movement of the movable means 204 is monitored by monitoring means 210 in a manner which will be described below.

The base part 202 is fastened to the apparatus along an axis C. Due to the movement of the eccentric 208, the motor 206 may rock during the provision of the edge portion. In fact, the movement of the motor 206 and eccentric 208 is the movement detected by the monitoring means 210, as this means is positioned so as to detect movement between the base part 202 and the eccentric 208.

The movement of the motor 206 is, due to the position of the eccentric 208, into and out of the plane of FIG. 4 and is monitored by the means 210, which detects the movement 90° out of phase with the movement of the movable part 204.

Thus, the means 210 is activated when the movable means 204 moves from the first position to the second position— that is, during provision of a registering edge portion—and deactivated during the opposite movement. The means 210 shifts its mode, when the moving means 204 is in its first and second position.

Using a means 210 in this manner, only a single means is sufficient for monitoring the movement of the moving means 204.

In order not to deform the sheet-like material during indentation thereof, the stationary means 202 preferably comprise a support surface 220 on which the sheet-like material may rest during indentation. Preferably, this surface 220, into which the movable means 204 are received subsequent to indentation of the sheet, has an edge 222 fitting the indenting edge 224 of the means 204. In this situation, only the part of the sheet closest to the position of indentation is influenced (and, thus, has a small risk of deformation) by the indentation.

As described above, it is preferred to be able to illuminate all parts of the sheet-like material. Thus, it is desired not to have any kind of shadowing elements positioned over the sheet-like material during illumination thereof. Thus, it is preferred that, subsequent to indentation, no part of the indentation or notch providing means 200 to any substantial degree extend beyond the plane of the sheet-like material positioned on the surface 220.

As may be seen from FIGS. 4 and 5, the moving means 204 and the stationary means 202 are manufactured so that the moving means 204 may be introduced completely into the stationary means 202 so as to not project above the support surface 220 of the stationary means 202. Thus, no part of the indentation means 200 may provide shadows during illumination of the sheet-like material.

The axial positions of the indentation of the sheet-like material may, naturally, be adapted to the individual needs or requirements the operator. However, at present, a rectangular indentation and an indentation as illustrated in FIG. 5, where parts of the outer contour of the movable means 204 comprise an edge portion defining part of a circle, are provided. These indentations help in positioning the illuminated sheet-like material in e.g. a printing machine.

A widely used European industry standard requires a distance between the two indentations of 220 or 425 mm and that these indentations be positioned symmetrically about the middle of the sheet-like material.

Thus, it may be required to provide either multiple indentation tools 200 or that one or more of these tools be movable so as to be able to each produce multiple indentations.

In FIG. 6, two indenting tools 200 are illustrated positioned at the periphery of the drum 12. In the present invention, it is preferred that the tools 200 are positioned symmetrically along the total periphery of the drum 12. In this manner, the tools 200 may provide indents in a material having the maximum size possible in the apparatus.

When introducing smaller pieces of material, this material is preferably positioned in the drum 12 so that the middle of the material is positioned at the middle of the periphery of the drum 12. In this manner, the indents are positioned symmetrically along the side of the material independently of the dimensions thereof.

However, providing e.g. four tools 200 facilitates providing the two notches with the two different distances of a widely used European industry standard without having to move the means 200 or the sheet-like material between the indentations of the sheet-like material.

When moving the tools 200 between two positions, each indenting means 200 may, alternatively, produce two indentations in the plate-like material. This provides the use of also other indenting standards in the present apparatus or the use of only a single tool 200.

An alternative apparatus will be one in which movable tools 200 or more than two thereof are provided in order to make the instrument more versatile so as to be able to accommodate different lengths of sheet-like material. This may, naturally, be highly preferred, when the length of the sheet-like material is often changed.

Subsequent to illumination of the front part of the sheet-like material, this material is removed from the drum 12 using at least the pairs of rollers 18 and 20 in the manner described hereinafter:

The sheet-like material is withdrawn from the drum 12 along the same path as that along which it was introduced from the spool 8 or 10 to a position where a cutting wheel 100 may separate the desired part of the sheet-like material from the rest of the length thereof—see FIG. 2.

Thus, by not cutting the sheet-like material until after illumination thereof, the full area of the part of the sheet-like material may be illuminated. A problem arises when the full area of a piece of material is to be illuminated to all four edges, as, during illumination, nothing can contact the upper surface to be illuminated thereon; any contact thereon may cause shadows to be formed in the illuminated image. This problem is solved in the present image setter due to the fact that the illuminated part of the sheet-like material is not separated from the rest of the length thereof until subsequent to the illumination thereof. Thus, during illumination, the rest of the length of sheet-like material may act as a "handle" with the aid of which the illuminated part of the sheet-like material may be removed from the drum 12.

Subsequent to illumination thereof, the sheet-like material is partly withdrawn from the drum 12 and the desired part of the sheet-like material is separated from the rest of the length thereof using the cutting wheel 100. In FIG. 2, the cutting wheel 100 is adapted to move into and out of the plane of FIG. 2 and to have a resting position, where it is out of engagement with the sheet-like material being fed or withdrawn.

In the present embodiment 2, the cutting wheel 100 is rigidly connected to a member 102 toward which the guide 34 is gently forced during feeding or removal of the sheet-like material. During cutting of the sheet-like material, the guide 34 is slightly displaced so as not to engage the body 102 during its movement into and out of the plane of FIG. 2.

Cutting of the sheet-like material is performed by moving the cutting wheel 100 into or out of the plane of FIG. 2 when the sheet-like material has been brought into position, i.e. where the desired cutting edge is positioned between the cutting wheel 100 and an opposite member 104 at the opposite side of the sheet-like material.

At present, rotation of the cutting wheel 100 is provided due to a friction member 106 positioned on the cutting wheel 100 and contacting the guide 30. Due to the engagement between the friction member 106 and the guide 30, the cutting wheel 100 will rotate when moved into and out of the plane of FIG. 2. Preferably, in order to help fix the sheet-like material during cutting, the lower part of the guide 30 is flexibly mounted so as to be forced against the sheet-like material positioned between the guide 30 and the opposite member 104 during cutting. As the material is stationary during cutting, substantially no damages will occur at the surface thereof.

Subsequent to cutting, the cut-off part of the sheet-like material having been illuminated is to be transferred to a developer section 110 (see FIG. 1) for development. This transfer is achieved by shifting the guides 32 and 34, which are rigidly interconnected, to a position illustrated by broken lines in FIG. 2 (34' and 32'), whereby the cut-off part of the sheet-like material may be guided by guides 112, 114, 116, 118 and 120 (see FIG. 1) as well as pairs of rollers 20, 122 and 124 into the developer section 110, which is known per se and will not be described in detail.

The movement of the guides 34 and 32 between the positions where the guide 34 is gently forced against the member 102, i.e. the feeding position, where sheet-like material is fed into the drum 12, the position cutting where there is no engagement between the guide 34 and the member 102, and the position 34', i.e. the position for removing the sheet-like material from the drum 12, is controlled by an eccentric member 126, against which the guides 34 and 32 are spring loaded, and which is moved by a step motor (not shown).

The rotation of the eccentric member 126 and, thus, the position of the guides 32 and 34 is monitored by a switch 128 which is positioned so as to detect the position 126" illustrated in FIG. 2, i.e. a position where the guides 32 and 34 are close to the removal position. Having detected this position 126'', it is a matter of simple calibration to determine the number of steps taken by the step motor (not shown) in order to bring the guides 32 and 34 into the cutting or feeding positions, respectively. The position 126'''' is the cutting position, position 126' is the feed position and the position 126''' is the removal position.

In order to provide a fast instrument capable of illuminating a large number of "images" it is required to remove the illuminated part of the sheet-like material as fast as possible in order to be able to introduce and illuminate the new front part of the sheet like material in the drum 12.

This may be counteracted by the fact that, usually, the velocity of the sheet-like material in the developer section 110 should be constant and quite low. Thus, in order to still be able to quickly remove the illuminated part of the sheet-like material from the drum 12, a buffer is provided to hold the sheet-like material during introduction thereof into the developing section 110 and in order to facilitate fast introduction of the new front part of the sheet-like material in the drum 12.

This buffer is provided between pairs of rollers 122 and 124 in the manner described below:

In the developer section 110, all pairs of rollers are connected to the same motor means (not shown) so that the movement of the sheet-like material in the developer section 110 is constant and well-defined. Thus, the pair of rollers 124 will engage with an introduced sheet-like material and provide it this velocity. However, in order to quickly remove the sheet-like material from the drum 12, the velocity provided by the pair of rollers 122 is preferably higher. Thus, providing the guide 116 in a manner so that it may rotate, the surplus of sheet-like material introduced between the pairs of rollers 122 and 124 (see broken line 115 in FIG. 1) forcing the guide 116 from a more horizontal position (as seen in FIG. 2) to a more vertical position (as seen in FIG. 1.

During operation of this buffer, it is preferred that the pair of rollers 122 holds the axially trailing end portion of the sheet-like material while the pair of rollers 124 introduce the front part of the sheet-like material into the developing section 110. This is presently accomplished by providing an edge detecting sensor 128 comprising e.g. a light emitter emitting light on to the back side of the sheet-like material and a light detector positioned so as to receive light reflected from the back side of the sheet-like material. This sensor 128 will be able to detect the presence of the farthest edge portion of the sheet-like material, whereafter it is simple to stop the rotation of the pair of rollers 122 when this edge portion is close thereto. It is furthermore preferred that the engagement between the pair of rollers 122 and the sheet-like material is so loose that no damage is incurred on the sheet-like material, when the buffer is emptied and the pair of rollers 124 "pulls" the sheet-like material out of engagement with the pair of rollers 122.

In the present embodiment, the pair of rollers 20 is preferably driven by a toothed belt 130 by motor means (not shown) and the pair of rollers 122 is driven by another toothed belt 132 by the same motor means (not shown) and via the pair of rollers 20. It is also preferred that the engagement between the toothed belt 132 and the pair of rollers 20 is a type where no torque is transferred to the pair of rollers 122, when the pair of rollers 20 is rotated so as to feed sheet-like material into the drum 12. Torque should only be transferred to the pair of rollers 122, when the pair of rollers 20 is rotated to as to remove sheet-like material from the drum 12.

After the development section 110, the developed sheet-like material is dried in a drying section 134 where two driers 136 and 138 apply drying air to both sides of the sheet-like material through guides 140 and 142, which are preferably made of e.g. a metal grid in order to provide access for the drying air to the developed material.

Subsequent to drying, the material is transferred to an exit section 144, where the material is transferred between two pairs of rollers 146 and 148 in each of which one roller is driven by a motor 150 by means of a belt 152. In order to stack the illuminated and developed pieces of sheet-like material, the motor 150 is preferably accelerated when transferring the last part of the sheet-like material from the drying section 134 to the exit section 144 along arrow A.

In order to provide a very versatile instrument, the sections 4 and 6 and the pertaining spools 8 and 10 are preferably able to hold and feed sheet-like material having different widths and/or thicknesses into the drum 12. Furthermore, the fact that more than one spool of material may be introduced will enable the instrument to illuminate a large number of images unattended such as during the night. However, in order to ensure that the instrument is able to perform a large number of illuminations without having to be attended by an operator, it is highly preferred to have a strict control with the translation of the sheet-like material in the instrument. Thus, especially when e.g. having to withdraw sheet-like material from the spool 10 back into compartment 6 in order to feed new material from the spool 8 in the compartment 4, it is crucial that the position of the front edge portion of the sheet-like material on the spool 10 is determined in order to maintain engagement therewith by the pair of rollers 44 in order to be able to subsequently again feed material from the spool 10 when required.

To this effect, two sensors 160 and 162 (see FIG. 2) of the same type as the sensor 128 are provided in order to detect the front edge portions of the material from the spools 10 and 8, respectively. Having detected the front edge portion of the material from one of the spools with the corresponding sensor, the movement of the motor means (not shown) driving the pairs of rollers 14 or 44, respectively, required in order to remove the sheet-like material but to retain engagement thereof with the pair of rollers 14 or 44, respectively, may easily be determined.

Additionally, in typical instruments of this type, it may cause severe problems when the sheet-like material from the spool runs out and is thereby introduced into the guiding system of the instrument. This problem is in some instruments solved by simply not cutting the last illuminated part of the sheet-like material into the correct dimensions and, thus, simply transferring this larger piece of sheet-like material through the system. However, this is not desired as, consequently, part of the illuminated images will, thus, still require manual attention and adaption to the desired dimensions.

In the present embodiment, this problem is solved by detecting the farthest edge portion of the material on the spools 8, 10, respectively, using sensor means 164 and 166, respectively, each comprising a light emitter and a light detector positioned on either side of the sheet-like material, the fact that the light detector may detect light from the light emitter means that the farthest edge portion of the sheet-like material on the respective spool has passed between the sensor means 164 or 166 and is close to the pairs of rollers 14 or 44, respectively. In the present embodiment, this will stop the motor means (not shown) driving the pair of rollers 14 or 44 and optionally additionally pairs of rollers 16, 18 and 20 in order to ensure that this last part of the sheet-like material is not transferred into the system. At present, it is preferred to simply withdraw the rest of the sheet-like material back into the compartment 4 or 6 in order for the operator to remove this part of the material when replacing the corresponding empty spool 8 or 10.

Even though the above-mentioned embodiment, wherein it is ensured that all illuminated pieces of sheet-like material are cut to the correct dimensions and that all any remaining parts of the sheet-like material is transferred back to the respective compartment, this embodiment has a disadvantage. This disadvantage is the fact that the remaining part of the sheet-like material transferred back into the respective compartment cannot be used and is, thus, considered as waste. The amount of waste is, naturally, the largest from compartment 4 due to the longer path therefrom to the drum 12. In order to reduce this amount of waste, the above-mentioned embodiment may be altered so as to adapt the guides and the pairs of rollers therein so that these elements are able transfer a certain length of sheet-like material from the cutting means and back into the respective compartment 4 or 6. In this manner, the back edge portion of the sheet-like material may be brought out of engagement with the pairs of rollers 44 or 14 so that yet another part of the sheet-like material may be used in the instrument. Having illuminated the front part of the rest of the sheet like material, the material is cut as described above and the last, small part of the sheet-like material may, then, be transferred back into the respective compartment 4 or 6.

In this embodiment, the controlling electronics (not shown) will be able to calculate, on the basis of the length of sheet-like material having been introduced in the drum 12 when the respective edge sensor 160 or 162 senses the farthest edge portion and the length of material between the respective sensor 160 or 162 and the drum 12, whether there is sufficient sheet-like material for the image, and whether the remainder of sheet-like material may be transferred back into the respective compartment. Should this be the case, the sheet-like material may be brought out of engagement with the respective pair of rollers 14 or 44 and the introduction of material into the drum 12, the illumination thereof and the cutting may be performed as usual. Subsequent to cutting, the rollers and guiding means of the instrument will then transfer the remainder of the sheet-like material back into the compartment for the operator to remove and replace with a new spool of sheet-like material.

At present, no positioning or correction of the sheet-like material in the direction into and out of the plane of FIGS. 1 or 2 is required if care is taken in the instrument not to stress the material. However, as the instrument may be positioned on heavily vibrating floors, such as beside a printing machine, it is presently preferred to position those parts of the instrument which are more sensitive to position displacements on resilient means, such as pieces of rubber, in order to reduce the influence of vibrations.

Thus, at present the compartments 4 and 6 and the guides and rollers for transferring the sheet-like material into the drum 12 as well as the drum 12 and the illumination carriage 180 are rigidly interconnected and positioned on resilient means 170 and 172. The advantage of rigidly interconnecting the compartments 4 and 6, the drum 12 and the carriage 180 and isolating these parts from the surroundings is obvious, since movements between these elements will introduce precision instabilities in the instrument, as the precision of the introduction and, thus, the position of the front part of the sheet-like material in the drum 12 will be reduced.

We claim:

1. An apparatus for irradiating a section forming an end portion of a length of a sheet-like material comprising a layer containing a photosensitive substance, where the boundary between said section and the rest of the length of material is defined by a divisional line, said apparatus comprising a supporting device defining a concavely curved, substantially circular cylindrical surface part, means for feeding the section in a first direction and into a first position in which the section is in abutting engagement with the cylindrical surface part and extends peripherally along the cylindrical surface part, irradiating means capable of irradiating at least a major part of said layer of said section containing said photosensitive substance and being adjacent to said divisional line, means for moving the length in a second direction substantially opposite to the first direction to a separating position, and separating means positioned at the separating position for separating the irradiated section from the rest of the length along said divisional line.

2. An apparatus according to claim 1, further comprising guiding means adapted to guide the section and to switch between a first and a second position where, in the first position, the guiding means are adapted to guide the section toward the supporting device when the feeding means feed the section of material and where, in the second position, the guiding means are adapted to guide the section away from the supporting device.

3. An apparatus according to claim 2, wherein the guiding means in their first position are positioned between the separating means and the axially extending edge portion of the supporting device at which the length enters the supporting device when moving in the first direction.

4. An apparatus according to claim 1, wherein the divisional line is substantially straight.

5. An apparatus according to claim 1, wherein the irradiating means are furthermore capable of irradiating substantially all of the layer of the section containing the photosensitive substance at an end portion of said section being opposite to said divisional line.

6. An apparatus according to claim 1, wherein the irradiating means are capable of irradiating substantially all of the layer of the section containing the photosensitive substance.

7. An apparatus according to claim 2, further comprising developing means for receiving and developing the separated and irradiated section, and wherein the guiding means in their second position are adapted to guide the section toward the developing means.

8. An apparatus according to claim 7, wherein said moving means comprise means for transferring the section with a first velocity and wherein said developing means comprise means for transporting the section at a substantially constant second velocity being smaller than said first velocity.

9. An apparatus according to claim 8, wherein said developing means and said guiding means interact so as to contain at least part of said section before and during introduction thereof into said developing means.

10. An apparatus according to claim 1, further comprising storing means for holding at least a part of the length.

11. An apparatus according to claim 10, wherein the storing means comprise sensor means for sensing the end of said length held in the storing means.

12. An apparatus according to claim 10, wherein the supporting device, the feeding means, the moving means, the irradiating means, the guiding means and the storing means are rigidly interconnected and vibrationally damped in relation to the rest of the apparatus.

13. An apparatus according to claim 1, further comprising means for retaining the section of sheet-like material in abutting engagement with the cylindrical surface part during irradiation thereof.

14. An apparatus according to claim 1, further comprising means for outputting the irradiated section of sheet-like material from the apparatus, said outputting means comprising means for translating said irradiated section during outputting, means for detecting the rear end of the section during translation thereof, and accelerating means for increasing the translation velocity of the section during outputting of at least the rear end of the section of sheet-like material.

15. A method of irradiating a section forming an end portion of a length of a sheet-like material comprising a layer containing a photosensitive substance, the method comprising:

- feeding the section in a first direction into abutting engagement with a concavely curved, substantially circular cylindrical surface part in a position in which the section extends peripherally along the cylindrical surface part,

- irradiating at least part of the layer of the section containing the photosensitive substance,

- moving the length of sheet-like material in a direction substantially opposite to the first direction to a separating position,

- separating the irradiated section from the rest of the length of sheet-like material, and

- removing the separated, irradiated section of sheet-like material from the separating position.

16. A method according to claim 15, wherein the moving step only brings said section of sheet-like material partially out of engagement with the cylindrical surface part, wherein the separation step is performed while part of the section is still in abutting engagement with the cylindrical surface part, and wherein the removal step brings the section out of abutting engagement with the cylindrical surface part.

17. A method according to claim 15, wherein guiding means are provided being adapted to guide the length and to shift between a first and a second position, where the guiding means are in the first position during the feeding step, the irradiation step, the moving step, and the separation step and are shifted to the second position subsequent to the separation step and prior to the removal step.

* * * * *